United States Patent [19]

Noren et al.

[11] 4,001,755
[45] Jan. 4, 1977

[54] ACTUATOR APPARATUS

[75] Inventors: Oscar B. Noren, Grosse Pointe Farms; Edmund J. Kwarsick, Detroit, both of Mich.

[73] Assignee: Parke, Davis & Company, Detroit, Mich.

[22] Filed: Dec. 19, 1975

[21] Appl. No.: 642,440

[52] U.S. Cl. .............................. 338/32 H; 323/94 H
[51] Int. Cl.² .................. H01L 43/00; H01L 43/02
[58] Field of Search ........... 338/32 R, 32 H; 335/1; 340/365 L; 323/94 H; 324/45, 46; 310/DIG. 3, 273

[56] References Cited

UNITED STATES PATENTS

| 2,500,953 | 3/1950 | Libman | 323/94 H X |
| 3,571,774 | 3/1971 | Hubrich | 338/32 R |
| 3,676,828 | 7/1972 | Masuda et al. | 338/32 H |
| 3,680,025 | 7/1972 | Kobayashi | 338/32 R |

Primary Examiner—C. L. Albritton
Attorney, Agent, or Firm—David B. Ehrlinger; George M. Richards; Stephen Raines

[57] ABSTRACT

Actuator apparatus comprising a metal body or magnet adapted to be carried in a fixed cyclical path on a pivot arm which in turn is adapted to be actuated over a wide frequency range by a second resiliently mounted pivot arm in tandem, and further comprising a field-sensitive element (such as a reluctance effect element, Hall effect device, proximity switch, reed switch or the like) in proximity to the path of the body for path-responsive high fidelity control of an operation such as switching, the field-sensitive element being sensitive to discrete change in magnetic force caused by the cyclical movement for production of an electronic control signal or pulse in phase with each cycle.

6 Claims, 3 Drawing Figures

ACTUATOR APPARATUS

SUMMARY AND DETAILED DESCRIPTION

The invention relates to an actuator which is cooperable with a field-sensitive element and particularly to such an actuator for the path-responsive control of an operation such as switching wherein a specially pivoted body is movable relative to a field-sensitive element for production of a single electronic control signal or pulse for each cycle of an operation such as switching.

It is known to arrange a field-sensitive element within the housing of a switch together with one or more magnets relatively movable toward each other for switching purposes. Such contactless switches compared to switches having mechanical contacts have several advantages such as essentially chatter-free performance, a long life, constant resistance to humidity and vibration, long operating efficiency and low operating force.

The prior art devices, however, have been limited in their capacity to switch effectively at high switching rates. Also, the prior art devices have been unsatisfactory when operated under adverse conditions such as when exposed to spillage of liquid, contaminating substances and the like.

It is therefore an object of the present invention to provide a new type of actuator which has the desired characteristics for an operation such as contactless switching and which additionally functions reliably at high cycle rates.

It is another object of the invention to provide an actuator or switch which is durable and can function in an adverse environment without failure.

These and other objects and advantages will be seen from the following description with reference to the accompanying drawing in which.

A DESCRIPTION OF THE PREFERRED EMBODIMENT

Figure 1:
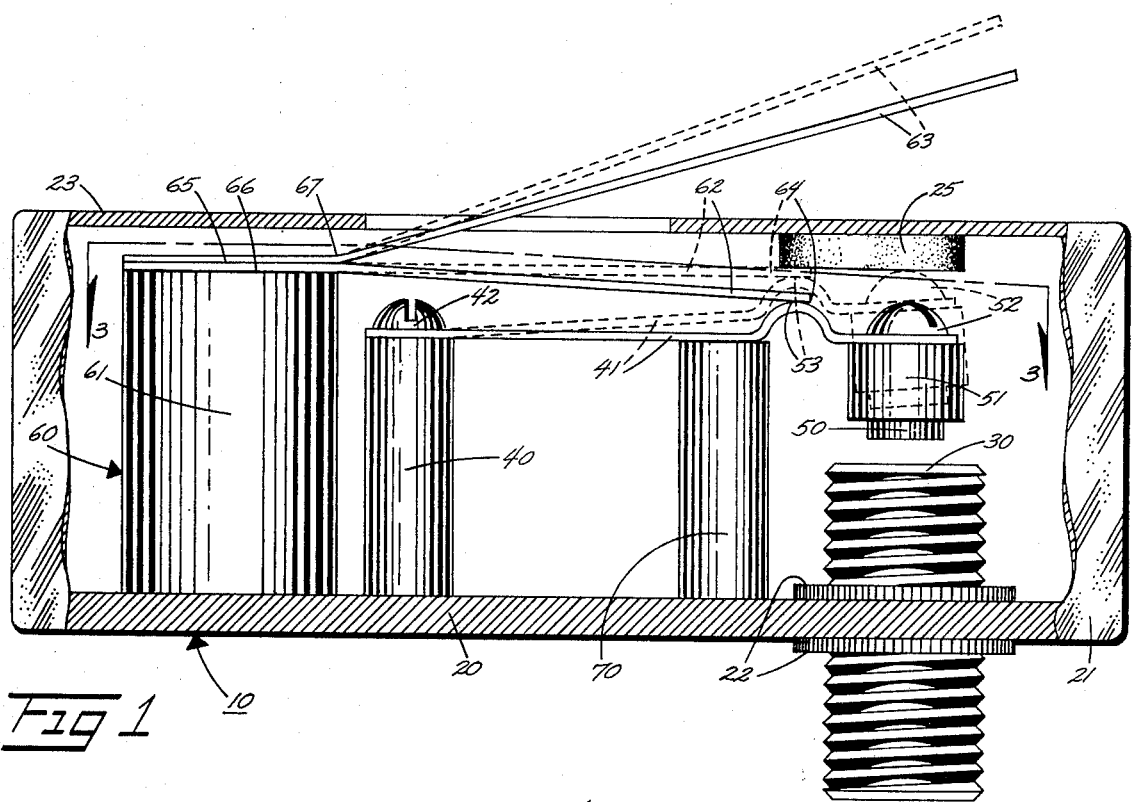
FIG. 1 is a side view of an actuator or switch shown partly in section.
Figure 2:
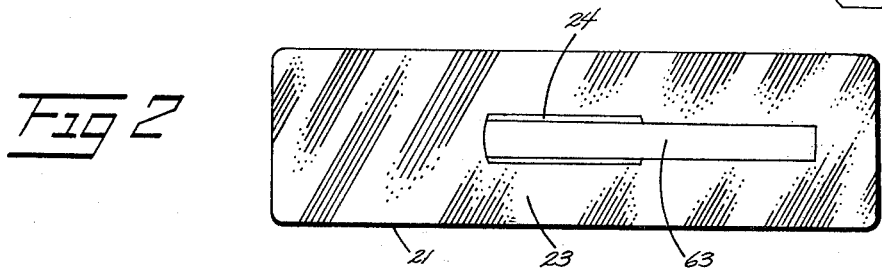
FIG. 2 is a top view of the actuator shown in FIG. 1.
Figure 3:
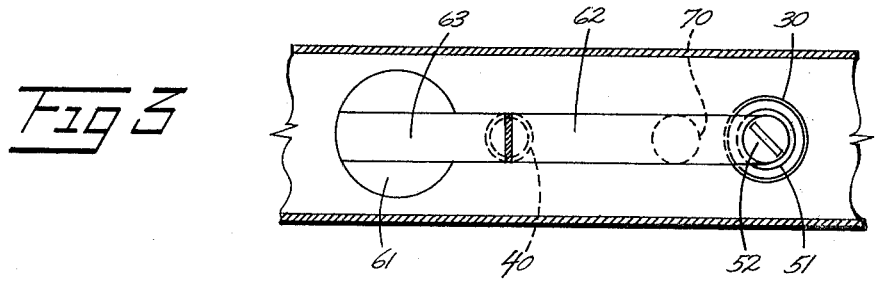
FIG. 3 is a top view taken on line 3—3 of FIG. 1.

Referring to the drawing, the actuator 10 shown in FIG. 1 has a rigid rectilinear base 20 which supports a protective cover 21 serving as a housing for the operating components of the actuator. Mounted in the base is a field-sensitive element 30 which in a preferred cylindrical shape is slideably mounted part-way through the base, threadably engaged on its circumference in fixed position by locking nuts 22. Thus, the degree to which the field-sensitive element is positioned within the housing 21 can advantageously be varied by appropriate adjustment of the locking nuts, for purposes which will be described presently. Also mounted on the base is a column 40 which supports a pivot arm 41 held at one end by screw 42. The other end of the arm carries a metallic body 50, which may be magnetic or nonmagnetic metal, held by a cup member 51 which in turn is fastened to the arm 41 by screw means 52. A portion of the arm 41 is in the form of an arch 53, the peak of which serves on its upper surface as a contact point for the arm 41 and a second pivot arm presently to be described.

The base 20 also carries a second pivot 60 which includes support 61, pivot arm 62 and a lever arm 63. The free end 64 of pivot arm 62 at its inner side serves as a contact point between pivot arm 62 and the arch 53 of pivot arm 41. The top 23 of the housing cover 21 has an open slot 24 through which the lever arm 63 projects. The inner side of the housing cover 21 adjacent to body 50 carries a pad 25 of absorbent material which serves as a stop limiting the outward travel of the body 50 within the housing. The base 20 further carries a stationary pivot stop 70 positioned adjacent the pivot arm 41 to limit the path of inward travel of pivot arm 41 and the associated body 50.

The component parts of the actuator apparatus of the invention can be made of various commercially available materials. The base 20, cover 21, column 40 and stop 70, all of which have a rigid structure, can, for example, be made of metal such as stainless steel or of durable plastic reinforced if desired with fiberglass or the like. The pivot arm 41 conveniently is made of corrosion-resistant spring material such as 0.005 inch phosphor bronze spring stock. The second pivot support 61 is made of a resilient material such as a No. 15 durometer silicone rubber or a coil spring mounting of equivalent resilience. The pivot arm 62 and lever arm 63 are suitably made of corrosion-resistant spring material such as 0.020 inch stainless steel. The pivot arm 62 and the lever arm 63 are welded together at overlap 65 and held by adhesive at 66 to the pivot support 61 where the latter is an elastomeric material or by welding where the latter is a coil spring. The support 61 is secured to the base 20 by similar means. The damper or absorbent pad 25 preferably is a silicone elastomer in a button shape secured to the inner housing wall by adhesive.

OPERATION

In operation, for counting purposes, the actuator device 10 is first mounted in a stationary position where the lever arm 63 intersects the path of passing objects such as the teeth on a revolving cog-wheel, conveyed production-line items, or the like. The field-sensitive element 30 is connected to an external load circuit (not shown) which functions upon variation of the output voltage, and to an external power source (not shown) which supplies the input current to the field-sensitive device. As each object passes the actuator device 10, it engages and moves the free end of lever arm 63 (shown in broken outline extending to fulcrum point 67) depressing it toward the top 23 of the housing cover 21 (to the position shown in solid outline). This in turn causes the second pivot arm 62 to pivot from fulcrum point 67 and its free end 64 to be depressed in engagement with the outer surface or peak of the arch 53. The pivot arm 41 (in a first position shown in dotted outline) is thereby caused to be pivoted inwardly from the pivot point 43 to a second position (shown in solid outline) at which its inward movement is limited to pivot stop 70. The movement causes a corresponding inward movement of the body 50 from the first position (in dotted outline) to the second position (in solid outline). As soon as the mentioned object has deflected and cleared the lever arm 63, the latter arm and its associated pivot arm 62 are quickly pushed outwardly to the first position (dotted outline) under action of the spring pivot arm 41 which is constantly biased outwardly. The outward motion is limited by contact of screwhead 52 against the damper pad 25, thus completing the cycle of inward and outward movement, the body thereby entering and leaving the domain of the field-sensitive element 30 so as to cause the element to generate a single signal signifying the occurrence of one counting event. Counting in this way can proceed indefinitely, at high speed if desired, and with great accuracy.

For purposes of the invention, the field-sensitive element 30 or the body 50, or both, may carry the magnetic field such that the described mechanical movement or cycle serves to cause a corresponding cyclical change in the magnetic state or flux to which element 30 is sensitive (i.e., traverses the operate and release points of the element) and in response to which a signal or pulse is generated. The pattern of magnetic flux change versus time is constant for each cycle being repeated indefinitely. A significant feature of the invention is that the excursion or relative movement between the first and second positions is also duplicated precisely with each cycle, even when exposed to a relatively harsh environment and even at high cycle rates up to 25 cycles per second or higher. Thus, the electronic response, e.g. a counting action, is highly accurate. Since the stresses and rubbing velocities on the bearing surfaces are minimal, the operating life of the actuator is extremely high.

While the invention in an actuator apparatus has been described in considerable detail, it will be realized that wide variation in such detail can be made by those skilled in the art without departing from the spirit of the invention as hereinafter claimed.

We claim:

1. Actuator apparatus comprising
   a field-sensitive signalling element responsive to local magnetic field change and producing an electrical signal with each such change,
   a body carried on a first pivot arm adapted for repetitive movement in a fixed path to and from first and second positions distal and proximal, respectively, to the field-sensitive element, said pivot arm in the absence of an activating force being biased by spring means to the first position, at least one of said field-sensitive element and body having magnetic field properties such that each cycle of the reciprocal movement of the body can be sensed by the field-sensitive element, thereby producing a single signal per cycle,
   a second pivot arm carried on a resilient support and having a free end adapted to be moved under an actuating force in a fixed path in engagement with said first pivot arm to cause the body to move from the first position to the second position, and
   lever means for applying actuating force to the second pivot arm to cause the body to move from the first position to the second.

2. Apparatus according to claim 1 where the body is a permanent magnet.

3. Apparatus according to claim 1 where the first pivot arm is a spring biased on a stationary support toward the first position.

4. Apparatus according to claim 1 where the first and second pivot arm are juxtaposed.

5. Apparatus according to claim 1 where the resilient support for the second pivot arm coacts with the spring bias of the first pivot arm to maintain engagement between said arms.

6. In an actuator apparatus comprising
   a field-sensitive signalling element responsive to local magnetic field change and producing an electrical signal with each such change, the combination comprising
   a metal body carried on a first pivot arm adapted for repetitive movement in a fixed path to and from first and second positions distal and proximal, respectively, to the field-sensitive element, said pivot arm in the absence of an activating force being biased by spring means to the first position,
   a second pivot arm carried on a resilient support and having a free end adapted to be moved under an actuating force in a fixed path in engagement with said first pivot arm to cause the body to move from the first position to the second position, and
   push means for applying actuating force to the second pivot arm to cause the body to move from the first position to the second.

* * * * *